(12) United States Patent
Chen et al.

(10) Patent No.: US 11,131,983 B2
(45) Date of Patent: Sep. 28, 2021

(54) SPATIAL DIFFERENCE MEASUREMENT

(71) Applicant: Hamilton Sundstrand Corporation, Charlotte, NC (US)

(72) Inventors: Yanzhi Chen, Shanghai (CN); Ranadip Acharya, Rocky Hill, CT (US); Tahany I. El-Wardany, Vernon, CT (US); Colette O. Fennessy, West Hartford, CT (US); William K. Tredway, Manchester, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/527,792

(22) Filed: Jul. 31, 2019

(65) Prior Publication Data

US 2021/0026323 A1 Jan. 28, 2021

(30) Foreign Application Priority Data

Jul. 26, 2019 (CN) .......................... 201910681586.5

(51) Int. Cl.
*G05B 19/4099* (2006.01)
*B33Y 50/02* (2015.01)
(Continued)

(52) U.S. Cl.
CPC ........ *G05B 19/4099* (2013.01); *B29C 64/393* (2017.08); *B33Y 50/02* (2014.12);
(Continued)

(58) Field of Classification Search
CPC ...... G05B 19/4099; G05B 2219/49007; G05B 2219/35134; G05B 2219/35017; G06F 30/23; B33Y 50/02; B29C 64/393
See application file for complete search history.

(56) References Cited

U.S. PATENT DOCUMENTS

| 2002/0013683 A1* | 1/2002 | Toyama | G06F 17/175 |
| | | | 703/2 |
| 2005/0024631 A1* | 2/2005 | Wild | B65B 57/10 |
| | | | 356/237.1 |

(Continued)

OTHER PUBLICATIONS

Tam, Roger, and Wolfgang Heidrich. "Shape simplification based on the medial axis transform", Oct. 2003, IEEE, https://ieeexplore.ieee.org/document/1250410.*

(Continued)

*Primary Examiner* — Charles R Kasenge
(74) *Attorney, Agent, or Firm* — Locke Lord LLP; Scott D. Wofsy; Gabrielle L. Gelozin

(57) ABSTRACT

A spatial difference measurement method, can include generating first key features of a first skeleton of a nominal 3D model of an object and extrapolating the first key features onto the nominal 3D model. The method can include creating an actual 3D model of the object during or after a construction process (real or simulated). The method can include generating second key features of a second skeleton of the actual 3D model of the object and extrapolating the second key features onto the actual 3D model of the object. The method can include comparing the first key features extrapolated on the nominal 3D model to the second key features extrapolated on the actual 3D model to determine one or more distances between the first and second key features to measure a spatial difference between the nominal 3D model and the object during or after construction.

14 Claims, 4 Drawing Sheets

(51) Int. Cl.
*B29C 64/393* (2017.01)
*G06F 30/23* (2020.01)

(52) U.S. Cl.
CPC .... *G06F 30/23* (2020.01); *G05B 2219/35017* (2013.01); *G05B 2219/35134* (2013.01); *G05B 2219/49007* (2013.01)

(56) References Cited

U.S. PATENT DOCUMENTS

| | | |
|---|---|---|
| 2014/0018953 A1* | 1/2014 | Bolin .................. G05B 19/4093 700/187 |
| 2015/0066179 A1 | 3/2015 | Stava |
| 2015/0339851 A1* | 11/2015 | Date ..................... G06T 17/205 345/420 |
| 2016/0086376 A1 | 3/2016 | Tang et al. |
| 2016/0159011 A1* | 6/2016 | Marchione .......... B29C 67/0088 700/98 |
| 2016/0300003 A1* | 10/2016 | Knoll ...................... G06F 30/23 |
| 2016/0320771 A1 | 11/2016 | Huang |
| 2018/0033194 A1* | 2/2018 | Goel ....................... G06T 15/06 |
| 2018/0293792 A1 | 10/2018 | Pavanaskar et al. |
| 2019/0004496 A1 | 1/2019 | Blom et al. |
| 2019/0047145 A1* | 2/2019 | Akeel .................... B25J 9/1697 |
| 2019/0099951 A1 | 4/2019 | Zhang et al. |
| 2019/0318479 A1* | 10/2019 | Ajri ....................... A61C 9/0093 |
| 2019/0329499 A1* | 10/2019 | Parangi ................. B33Y 50/00 |

OTHER PUBLICATIONS

Min-Wen Chao et al: "A graph-based shape matching scheme for 3D articulated objects"; Computer Animation and Virtual Worlds, vol. 22, No. 2-3, Apr. 2011 (Apr. 2011) pp. 295-305, XP055747548; GB ISSN: 1546-4261, DOI: 10.1002/cay.396; * abstract, sections 1-8, Figs. 1-12.

Andrea Tagliasacchi et al: "3D Skeletons:; A State-of-the-Art Report",; Computer Graphics Forum : Journal of the; European Association for Computer; Graphics; vol. 35, No. 2, May 2016 (May 2016), pp. 573-597, XP055747616; Oxford; ISSN: 0167-7055, DOI: 10.1111/cgf.12865; *abstract, sections 1-7, Figs. 1-27.

Extended European search report issued in corresponding EP application No. 20187997.0, dated Nov. 16, 2020.

* cited by examiner

SPATIAL DIFFERENCE MEASUREMENT

CROSS-REFERENCE TO RELATED APPLICATIONS

This application claims priority under 35 U.S.C. § 119(a) to Chinese Patent Application No. CN201910681586.5 filed in China on Jul. 26, 2019, the entire contents of which are herein incorporated by reference.

FIELD

This disclosure relates to spatial difference measurement, e.g., for additive manufacturing systems and processes for the purpose of distortion compensation.

BACKGROUND

Change of geometry occurs during Additive Manufacturing (AM) process due to volume shrinkage, springback due to stress relief, etc. One of the major steps in certain additive manufacturing processes is to measure the spatial difference between pairwise 3D models, e.g., an input nominal model and an actual additively manufactured (simulated or real) model (e.g., for distortion compensation, experimental/ printing results evaluation). Traditional methods need to manually choose reference points/surface/edge, compare a distance between surface points on these two models, and report their accuracy in terms of length, angular, edge, etc. However, these kinds of methods heavily rely on the choice of reference, such that slight change will cause significant difference in measurement results. Thus, traditional methods can be unreliable and inaccurate.

Such conventional methods and systems have generally been considered satisfactory for their intended purpose. However, there is still a need in the art for improved spatial difference measurement methods and systems. The present disclosure provides a solution for this need.

SUMMARY

A spatial difference measurement method can include generating first key features of a first skeleton of a nominal 3D model of an object and extrapolating the first key features onto the nominal 3D model. The method can include creating an actual 3D model of the object during or after a construction process (real or simulated). The method can include generating second key features of a second skeleton of the actual 3D model of the object and extrapolating the second key features onto the actual 3D model of the object. The method can include comparing the first key features extrapolated on the nominal 3D model to the second key features extrapolated on the actual 3D model to determine one or more distances between the first and second key features to measure a spatial difference between the nominal 3D model and the object during or after construction.

In certain embodiments, the method can include receiving the nominal 3D model of an object, and generating the first skeleton based on the nominal 3D model. The method can include generating the second skeleton based on the actual 3D model.

Generating the first skeleton can include converting the nominal 3D model into a first finite element mesh using median axis method, for example. In certain embodiments, generating the second skeleton can include converting the actual 3D model into a second finite element mesh using median axis method.

In certain embodiments, generating the first key features and generating the second key features can include using nodes of the first skeleton and the second skeleton, respectively. Extrapolating the first key features and extrapolating the second key features can include projecting the first key features and second key features to a surface of the nominal 3D model and the actual 3D model, respectively, for example.

In certain embodiments, the construction process can be an additive manufacturing process and the method can include additively manufacturing the object based on nominal 3D model. Comparing can be done in real time and the method can include modifying one or more characteristics of the additive manufacturing process to account for the measured spatial difference.

In accordance with at least one aspect of this disclosure, a non-transitory computer readable medium can include computer executable instructions configured to cause a computer to perform any suitable method(s) and/or portion(s) thereof disclosed herein (e.g., described above). Any other suitable method(s) and/or portion(s) thereof are contemplated herein.

In accordance with at least one aspect of this disclosure, a system can include a spatial difference measurement module configured to perform any suitable method(s) and/or portion(s) thereof disclosed herein (e.g., described above). The spatial difference measurement module can be configured to output a spatial difference value, for example. The spatial difference measurement module can be configured to control an additive manufacturing process and to modify at least one characteristic of the additive manufacturing process as a function of the spatial difference value. The module can include any suitable hardware and/or software to perform the desired function as appreciated by those having ordinary skill in the art in view of this disclosure.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
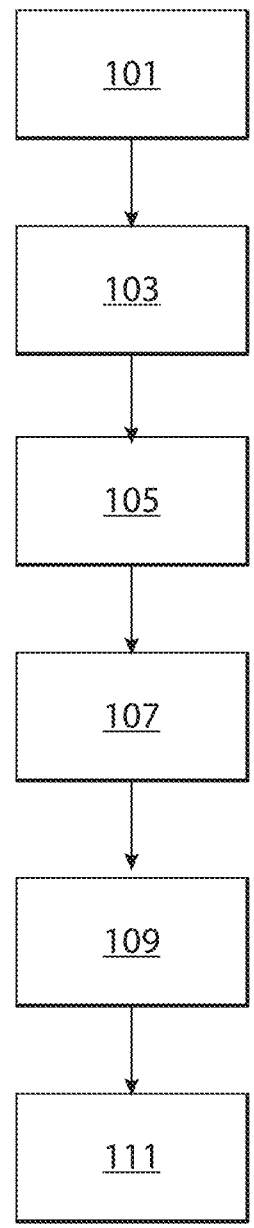
FIG. 1 is a flow diagram of an embodiment of a method in accordance with this disclosure.

Reference will now be made to the drawings wherein like reference numerals identify similar structural features or aspects of the subject disclosure. For purposes of explanation and illustration, and not limitation, an illustrative view of an embodiment of a method in accordance with the disclosure is shown in FIG. 1 and is designated generally by reference character 100. Other embodiments and/or aspects of this disclosure are shown in FIGS. 2-5.

Figure 2:
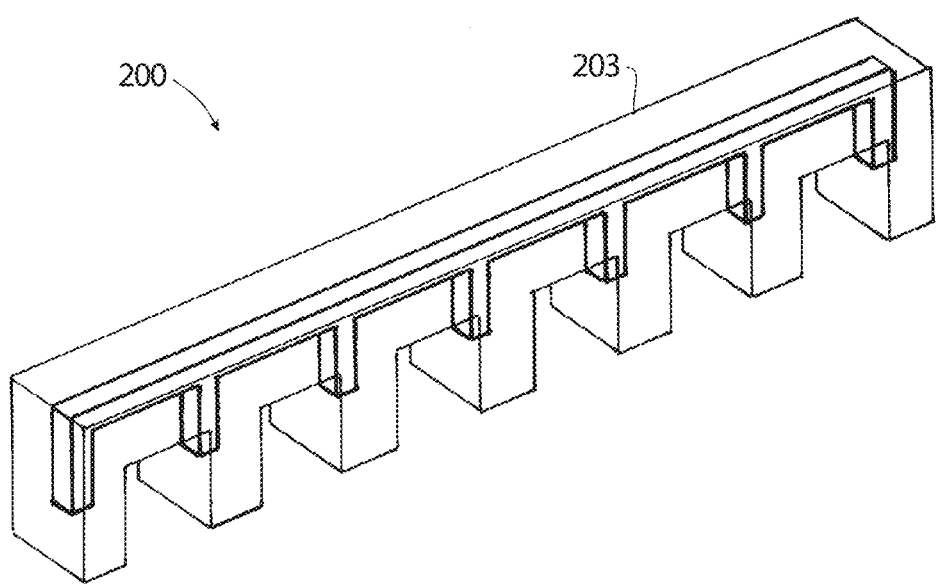
FIG. 2 is a perspective view of an embodiment of a digital nominal 3D model of an object in accordance with this disclosure.
Figure 3:
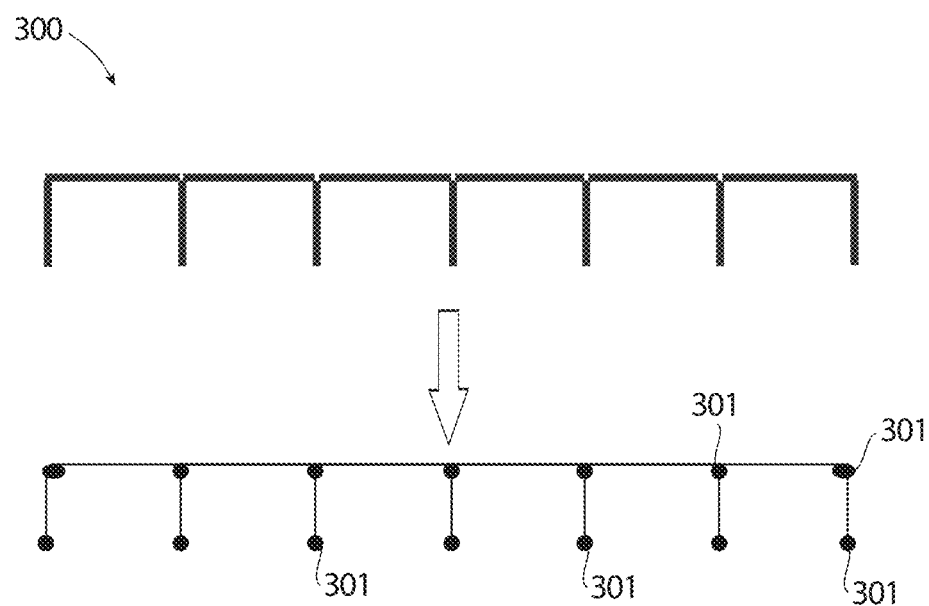
FIG. 3 is a plan view of a first skeleton model of the nominal 3D model of FIG. 1 and generation of first key features on the first skeleton.
Figure 4:
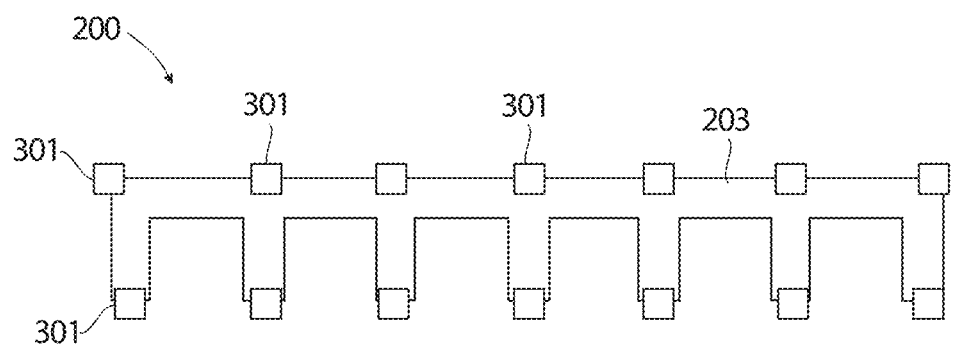
FIG. 4 is a plan view of the nominal 3D model of FIG. 1, showing the first key features of FIG. 2 extrapolated to the nominal 3D model (e.g., projected to the outer surface)

Referring to FIGS. 1, 2, and 3, a spatial difference measurement method can include generating (e.g., at block 101) first key features 201 of a first skeleton 300 of a nominal 3D model 200 of an object (e.g., any suitable article of manufacture). Referring additionally to FIG. 4, the method 100 can include extrapolating (e.g., at block 103) the first key features 301 onto the nominal 3D model 200. As disclosed herein, a 3D model can be a CAD model or any other suitable computer generated model.

Figure 5:
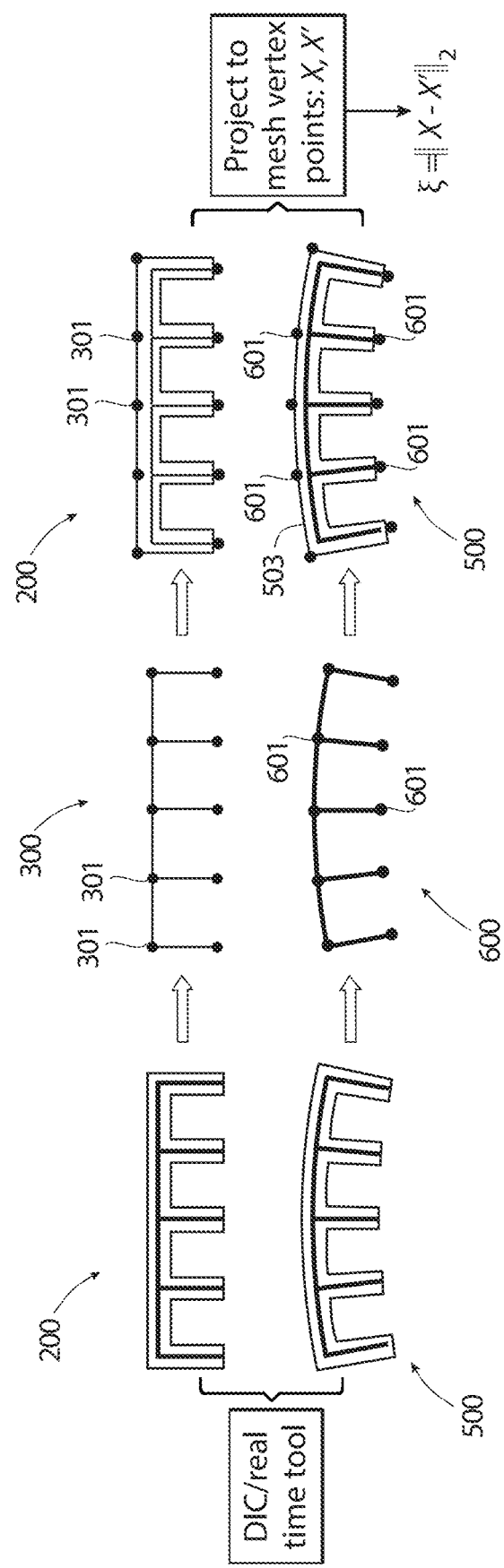
FIG. 5 shows the comparison of the nominal 3D model to an actual 3D model to measure spatial difference based on relative locations of the first key features of the nominal 3D model relative to second key features of the actual 3D model.

Referring additionally to FIG. 5, the method 100 can include creating (e.g., at block 105) an actual 3D model 500 of the object during or after a construction process (real or simulated). For example, digital image correlation (DIC) can be used during a build process or after a build process to form the actual 3D model 500 based on digital images.

The method 100 can include generating (e.g., at block 107) second key features 601 of a second skeleton 600 of the actual 3D model of the object and extrapolating (e.g., at block 109) the second key features 601 onto the actual 3D model 500 of the object, e.g., as shown in FIG. 5. The method 100 can include comparing (e.g., at block 111) the first key features 301 extrapolated on the nominal 3D model 200 to the second key features 601 extrapolated on the actual 3D model 500 to determine one or more distances between the first and second key features 301, 601 to measure a spatial difference between the nominal 3D model 200 and the object during or after construction (e.g., represented by the actual 3D model 500 which can be deformed from the nominal 3D model 200). It is contemplated that the construction of the object can be real or simulated to create the actual 3D model 500.

In certain embodiments, the method 100 can include receiving the nominal 3D model 200 of an object, and generating the first skeleton 300 based on the nominal 3D model 200. However, it is contemplated that the first skeleton 300 can be provided instead of generated as part of the method 100.

In certain embodiments, the method 100 can include generating the second skeleton 600 based on the actual 3D model 500. This can be done in real-time (e.g., using DIC) or after the completion of the construction (real or simulated) of the object.

Generating the first skeleton 300 can include converting the nominal 3D model 200 into a first finite element mesh, e.g., as shown, using median axis method, for example. In certain embodiments, generating the second skeleton 600 can include converting the actual 3D model 500 into a second finite element mesh using median axis method. Any other suitable method to create the first and/or second skeleton 300, 600 is contemplated herein.

In certain embodiments, generating the first key features 301 and generating the second key features 601 can include using nodes of the first skeleton 300 and the second skeleton 600, respectively. For example, the nodes can be connection points of at least some, if not all, of the finite elements (e.g., the stick like members shown) of the respective skeleton 300, 600. Any other suitable points for key features 301, 601 are contemplated herein.

As shown in FIGS. 4 and 5, extrapolating the first key features 301 and extrapolating the second key features 601 can include projecting the first key features 301 and second key features 601 to a surface 203, 503 of the nominal 3D model 200 and the actual 3D model 500, respectively, for example. In certain embodiments, the one or more key features 601 next to a single corner can be projected to the single corner (e.g., as shown in FIGS. 4 and 5).

In certain embodiments, the construction process (real or simulated) can be an additive manufacturing process (e.g., laser powder bed fusion, plastic deposition, etc.) and the method 100 can include additively manufacturing the object based on nominal 3D model 200. In this regard, the nominal 3D model 200 can be sliced into layers for layer-wise manufacture, e.g., as appreciated by those having ordinary skill in the art. Comparing 111 can be done in real time (e.g., by a machine controller of an additive manufacturing machine), e.g., with each layer, to monitor the construction process in real time (e.g., to predict an ultimate outcome of a finally constructed object). In this regard, it is contemplated that the method 100 can be performed layer by layer such that each layer of the actual 3D model is modeled and compared to the respective layer of the nominal 3D model 200 as the construction process proceeds. In certain embodiments, a predicted final model can be created based on less than all layers and/or compared to the nominal 3D model 200, for example.

Using one or more embodiments above, the method 100 can include modifying one or more characteristics (e.g., by the machine controller) of the additive manufacturing process to account for the measured spatial difference. For example, if a spatial difference between layers of each model (or between a predicted final model and the nominal model) is above a threshold, a laser power and/or scan speed can be modified for at least the next layer to modify thermal gradients to cause regression to the nominal model (to reduce spatial difference). Any suitable process steps can be taken to cause regression to the nominal model, for example.

Certain embodiments of a skeleton setup method can include median axis method (e.g., see Tam, Roger, and Wolfgang Heidrich. "Shape simplification based on the medial axis transform." Visualization, 2003. VIS 2003. IEEE. IEEE, 2003, incorporated by reference herein) to set up a skeleton for a 3D model. FIG. 2 shows an example of skeleton detection results of a 7-support bridge model. The result is composed of collections of joints and parts, as shown in FIG. 3. In the example shown, the 7-support bridge results in 13 parts and 14 joints.

Certain embodiments of a key feature generation method can include utilizing the joint points to identify key features for spatial difference measurement. Usually measurement of a 3D part is conducted on surface, therefore the joint points can be projected back onto the surface of the 3D model and the key features will then be extrapolated onto the 3D model for use in comparison, as shown in FIGS. 4 and 5.

In accordance with at least one aspect of this disclosure, a non-transitory computer readable medium can include computer executable instructions configured to cause a computer to perform any suitable method(s) and/or portion(s) thereof disclosed herein (e.g., described above). Any other suitable method(s) and/or portion(s) thereof are contemplated herein. For example, a machine controller of an additive manufacturing machine can include a non-transitory computer readable medium and be configured to execute any suitable portion(s) of any suitable method disclosed herein, e.g., as described above). For example, the machine controller can perform all portions of one or more methods disclosed herein, e.g., as described above.

In accordance with at least one aspect of this disclosure, a system can include a spatial difference measurement module configured to perform any suitable method(s) and/or portion(s) thereof disclosed herein (e.g., described above). The spatial difference measurement module can be configured to output a spatial difference value, for example. The spatial difference measurement module can be configured to control an additive manufacturing process and to modify at least one characteristic of the additive manufacturing process as a function of the spatial difference value. The spatial difference measurement module can include any suitable hardware and/or software to perform the desired function as appreciated by those having ordinary skill in the art in view of this disclosure.

Embodiments include a spatial difference measurement method to evaluate shape change of an object relative to its intended shape both efficiently and effectively. Embodiments take advantage of a skeleton of a 3D model, the topology and geometry of a class of 3D objects, to conduct shape alignment as well as define spatial residual. Using embodiments of this disclosure, spatial difference is structure-based, which means the measurement results are view point and affine invariant. Previous methods usually need to extract and scan surface points by software to i) build mesh, ii) select reference, and iii) calculate "L2" distance among them. Instead, certain embodiments only compute the spatial difference between the nominal and detected key features.

Certain embodiments can include a skeleton-based 3D model difference measurement method including i) skeleton setup to capture the 3D structure of pairwise given 3D models (e.g., a nominal model and an actual/deformed model), ii) key feature detection, e.g., to align skeleton with the 3D model (i.e., vertex of mesh/finite element nodes), iii) use of a real time tool such as DIC to track the final shape in experiment, and iv) determine spatial difference as:

$$\varepsilon = \|X - X'\|_2$$

where X and X' are aligned key features of nominal and actual (e.g., deformed) models, respectively.

Using embodiments disclosed herein, the spatial differences can be captured from a 3D model skeleton, which reflects the 3D shape profile which is both scale and affine invariant. The key features can be a subset of node points of a 3D model, and thus, many outliers introduced by scanning and shape changes during simulation can be avoided. Certain embodiments can be used in real time, e.g., during printing experiments, using tools like DIC that can track the strain. Embodiments can be used for potential distortion compensation in additive manufacturing during the building of the part, for example.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A spatial difference measurement method, comprising:
generating first key features of a first skeleton of a nominal 3D model of an object;
extrapolating the first key features onto the nominal 3D model;
creating an actual 3D model of the object during or after a construction process of the object;
generating second key features of a second skeleton of the actual 3D model of the object;
extrapolating the second key features onto the actual 3D model of the object; comparing the first key features extrapolated on the nominal 3D model to the second key features extrapolated on the actual 3D model to determine one or more distances between the first and second key features to measure a spatial difference between the nominal 3D model and the object during or after the construction process;
receiving the nominal 3D model of an object, and generating the first skeleton based on the nominal 3D model, wherein the method includes generating the second skeleton based on the actual 3D model, wherein generating the first skeleton includes converting the nominal 3D model into a first finite element mesh using median axis method.

2. The method of claim 1, wherein generating the second skeleton includes converting the actual 3D model into a second finite element mesh using median axis method.

3. The method of claim 1, wherein generating the first key features and generating the second key features includes using nodes of the first skeleton and the second skeleton, respectively.

4. The method of claim 3, wherein extrapolating the first key features and extrapolating the second key features includes projecting the first key features and second key features to a surface of the nominal 3D model and the actual 3D model, respectively.

5. The method of claim 4, wherein the construction process is an additive manufacturing process and the method includes additively manufacturing the object based on the nominal 3D model.

6. The method of claim 5, wherein comparing is done in real time and the method includes modifying one or more characteristics of the additive manufacturing process to account for the measured spatial difference.

7. A non-transitory computer readable medium comprising computer executable instructions configured to cause a computer to perform a method, the method comprising:
generating first key features of a first skeleton of a nominal 3D model of an object;
extrapolating the first key features onto the nominal 3D model;
creating an actual 3D model of the object during or after a construction process of the object;
generating second key features of a second skeleton of the actual 3D model of the object;

extrapolating the second key features onto the actual 3D model of the object; and comparing the first key features extrapolated on the nominal 3D model to the second key features extrapolated on the actual 3D model to determine one or more distances between the first and second key features to measure a spatial difference between the nominal 3D model and the object during or after the construction process, wherein the method includes receiving the nominal 3D model of an object, and generating the first skeleton based on the nominal 3D model, wherein the method includes generating the second skeleton based on the actual 3D model, wherein generating the first skeleton includes converting the nominal 3D model into a first finite element mesh using median axis method.

8. The non-transitory computer readable medium of claim 7, wherein generating the second skeleton includes converting the actual 3D model into a second finite element mesh using median axis method.

9. The non-transitory computer readable medium of claim 7, wherein generating the first key features and generating the second key features includes using nodes of the first skeleton and the second skeleton, respectively.

10. The non-transitory computer readable medium of claim 9, wherein extrapolating the first key features and extrapolating the second key features includes projecting the first key features and second key features to a surface of the nominal 3D model and the actual 3D model, respectively.

11. The non-transitory computer readable medium of claim 10, wherein the construction process is an additive manufacturing process and the method includes additively manufacturing the object based on the nominal 3D model.

12. The non-transitory computer readable medium of claim 11, wherein comparing is done in real time and the method includes modifying one or more characteristics of the additive manufacturing process to account for the measured spatial difference.

13. A system, comprising:
a spatial difference measurement module configured to:
generate first key features of a first skeleton of a nominal 3D model of an object;
extrapolate the first key features onto the nominal 3D model;
create an actual 3D model of the object during or after a construction process of the object;
generate second key features of a second skeleton of the actual 3D model of the object;
extrapolate the second key features onto the actual 3D model of the object;
compare the first key features extrapolated on the nominal 3D model to the second key features extrapolated on the actual 3D model to determine one or more distances between the first and second key features to measure a spatial difference between the nominal 3D model and the object during or after the construction process;
receive the nominal 3D model of an object;
generate the first skeleton based on the nominal 3D model, wherein generating the first skeleton includes converting the nominal 3D model into a first finite element mesh using median axis method;
generate the second skeleton based on the actual 3D model, and
output a spatial difference value.

14. The apparatus of claim 13, wherein the spatial difference measurement module is configured control an additive manufacturing process, wherein the special difference measurement module is configured to modify at least one characteristic of the additive manufacturing process as a function of the spatial difference value.

* * * * *